United States Patent
Davis

(10) Patent No.: US 7,107,034 B2
(45) Date of Patent: Sep. 12, 2006

(54) HIGH FREQUENCY AND LOW NOISE INTERCONNECT SYSTEM

(75) Inventor: Richard F. Davis, La Habra, CA (US)

(73) Assignee: The Boeing Company, Chicago, IL (US)

( * ) Notice: Subject to any disclaimer, the term of this patent is extended or adjusted under 35 U.S.C. 154(b) by 431 days.

(21) Appl. No.: 10/608,741

(22) Filed: Jun. 27, 2003

(65) Prior Publication Data

US 2004/0266384 A1 Dec. 30, 2004

(51) Int. Cl.
*H04B 1/10* (2006.01)
*H01R 4/58* (2006.01)
*H01R 13/648* (2006.01)

(52) U.S. Cl. ............. 455/296; 455/300; 455/301; 439/86; 439/88; 439/607; 439/578; 174/68.1

(58) Field of Classification Search ............ 455/296, 455/300, 301, 81, 114.1, 114.2, 575.5, 280–283; 439/86, 88–90, 108, 63, 578, 581, 587, 607–610; 333/260, 246, 248, 222; 174/68.1, 73.1, 174/75 C, 88 C
See application file for complete search history.

(56) References Cited

U.S. PATENT DOCUMENTS

| | | | |
|---|---|---|---|
| 4,521,754 A * | 6/1985 | Ranghelli et al. ........... 333/224 |
| 4,534,602 A * | 8/1985 | Bley ........................... 439/63 |
| 5,363,075 A | 11/1994 | Fanucchi | |
| 6,857,891 B1 * | 2/2005 | Morelli ....................... 439/319 |
| 2002/0186107 A1 * | 12/2002 | Drackner et al. ........... 333/260 |
| 2004/0038587 A1 * | 2/2004 | Yeung et al. ............... 439/581 |
| 2004/0203289 A1 * | 10/2004 | Ice et al. .................... 439/607 |

* cited by examiner

*Primary Examiner*—Duc M. Nguyen
(74) *Attorney, Agent, or Firm*—Ingrassia Fisher & Lorenz, P.C.

(57) ABSTRACT

Methods and apparatus are provided for an interconnect system for coupling radio frequency signals from one component to another in a RF system. The interconnect system acts as a coaxial connection. The apparatus comprises an interconnect, a dielectric sleeve, and a conductive elastomeric gasket. The interconnect has a first major surface and second major surface for providing an electrical connection. A through hole is formed in a first component. The dielectric sleeve is placed in the through hole. The interconnect is placed in the dielectric sleeve. The conductive elastomeric gasket is placed in proximity to the through hole contacting the first component and a second component. The RF system is assembled compressing the elastomeric gasket to have intimate contact with the first and second component. The intimate contact electrically connects the first and second component and an electric shield is formed around the interconnect thereby suppressing the reception and transmission of RF signals.

8 Claims, 4 Drawing Sheets

HIGH FREQUENCY AND LOW NOISE INTERCONNECT SYSTEM

TECHNICAL FIELD OF THE INVENTION

The present invention generally relates to component interconnect, and more particularly relates to components operating at high frequencies requiring interconnect in close proximity to one another.

BACKGROUND OF THE INVENTION

The means in which to interconnect components of a system is often as critical as the components themselves. One such situation is in the connection of components carrying radio frequency signals. The connections themselves can become transmitters and receivers of the radio frequency signals. The problem is exacerbated when the interconnections are in close proximity to one another where the integrity of the information being received could be jeopardized. Other issues such as the number of interconnect, connection reliability over a wide range of environmental factors or the complexity of the components being interconnected are factors that must be weighed in the design of a system.

One application, which has an abundance of these issues, is a communications satellite. A communications satellite operates at extremely high frequencies, for example, 5–20 gigahertz thus making radio frequency coupling a critical issue. Moreover, a communications satellite handles a large number of signals simultaneously yet must be made in the smallest package possible. Along with reducing package size there is a need to reduce the weight of each component that comprises the satellite. From an interconnect perspective; the focus is on increasing connector density, simplification of assembly, part reduction, and improved reliability.

Microwave Integrated Circuits (MIC's) and Monolithic Microwave Integrated Circuits (MMIC's) are modules often used in communication satellites and other devices operating at radio frequencies. Many of the MIC's and MMIC's are custom-built module assemblies composed of microstrip substrates supported by machined Kovar and aluminum parts. These individual module assemblies are grouped together in a machined aluminum chassis to perform more complex functions. The machined aluminum chassis is a complex array of radio frequency circuit cavities, DC wiring channels and precision mounting bosses, typically custom designed for each application. The resulting assembly is complex, expensive, and capable of achieving only those functions, which are designed into it.

Accordingly, it is desirable to provide an interconnect that is suitable for carrying radio frequency signals. In addition, it is desirable to eliminate difficult assembly processes such as soldering in confined areas. Also, it is extremely beneficial to increase interconnect density while reducing radio frequency coupling between interconnect. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

An apparatus is provided for interconnection between components of a radio frequency system. The apparatus comprises a compressible bellows interconnect. The compressible bellows interconnect is placed in the dielectric sleeve. A conductive elastomeric gasket is used to shield a portion of the compressible bellows interconnect.

A method is provided for reducing radio frequency coupling between interconnects in a radio frequency system. The method comprises a first component in which more than one hole is formed there through. The first component is electrically conductive. A conductive elastomeric gasket is placed in proximity to each of the more than one holes. Each conductive elastomeric gasket contacts and first component and a second component. A shield is formed around each interconnect suppresses the transmission and reception of radio frequency signals.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
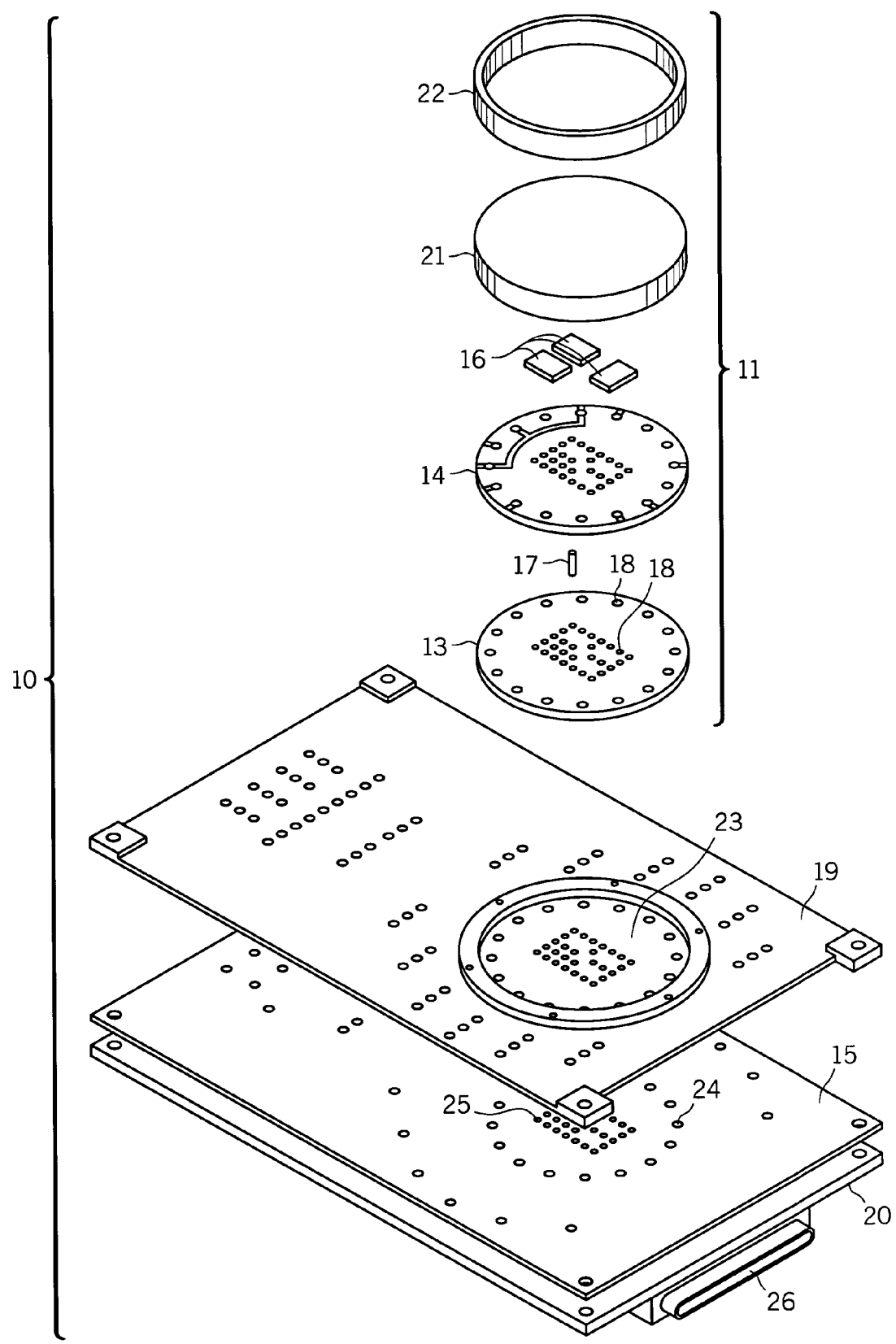
FIG. 1 is an exploded view of a prior art radio frequency system.

FIG. 1 is an exploded view of a prior art radio frequency system 10. Radio frequency system 10 operates at high frequencies. For example, radio frequency system 10 in a communication satellite system would operate at microwave frequencies in the 5–20 gigahertz range. Moreover, there can be many active signal paths operating simultaneously and in close proximity to each other within radio frequency system 10. These signals can radiate if not shielded correctly and picked up on other signal paths thereby introducing noise that can affect the integrity of the signals being processed.

An assembly 11 is sized to be received within cavity 23. Assembly 11 is a radio frequency circuit requiring interconnects to and from assembly 11. A header 13 is preferably constructed of Kovar, an iron nickel cobalt alloy, or a similar alloy or other similar material. Header 13 includes through holes 18 or openings for interconnect that couples an integrated circuit board 14 to a radio frequency (RF) distribution board 15. The interconnect that placed through holes 18 in header 13 will be described in more detail herein below.

Integrated circuit board 14 may perform a variety of functions including the processing of radio frequency and DC signals. Integrated circuit board 14 includes electronic components 16. Electronic components 16 can be integrated circuits, monolithic microwave integrated circuits (MMICs), passive components, or other well known electrical devices used to form a circuit. Electronic components 16 are coupled to integrated circuit board using well-known interconnection techniques such as soldering, connector pins or sockets. Although only three electronic components 16 are shown, assembly 11 can be designed to accommodate the number of components required for the particular application. Integrated circuit board 14 is affixed to header 13 during assembly. Therefore, integrated circuit board 14 is preferably sized similarly to that of header 13. As those skilled in the art will recognize, mechanical means for aligning integrated circuit board 14 and header 13 may be used. For example, a dowel pin or other mechanical key may be used.

Integrated circuit board 14 can be quite sophisticated and may comprise a multi-layer substrate with each layer having interconnect. For example, more than 20 layers. Various materials including low temperature-cofired ceramic (LTCC) or a polyimide may be used as he layers of integrated circuit board 14. The number of layers, the material used and the circuit interconnections through the layers are dependent upon the function of radio frequency system 10.

Pins 17 are coupled to integrated circuit board 14. Although only one pin 17 is illustrated, many pins are used in RF system 10. Pins 17 are typically used for coupling radio frequency signals but can also be used for carrying DC. Pins 17 contact integrated circuit board 14 couple through holes 18 in header 13 and corresponding holes in an integration plate 19 to contact radio frequency distribution board 15. Pins 17 may also couple through holes in RF distribution board 15 to contact a distribution layer 20. As an example of the complexity involved, connection points on RF distribution board 15 may not only reside on the surface but may be on some layer beneath the surface. Areas of the RF distribution board 15 are etched out to expose contact points beneath the surface. Thus, it can be seen that conventional techniques of interconnect are not feasible or cost effective when many contacts are required to several different structures at many different levels.

A cover 21 is used to enclose assembly 11. Cover 21 may also be formed of Kovar. Cover 21 may be welded or otherwise bonded, or held in place by spanner ring 22, to header 13. For various implementations, cover 21 may hermetically seal assembly 11. In an embodiment of assembly 11, spanner ring 22 is used to secure assembly 11 to a floor of cavity 23 on integration plate 19. Spanner ring 22 provides force for RF ground between assembly 11 and integration plate 19 allowing dense grouping of RF ports resulting in smaller, lighter assembly.

A radio frequency (RF) distribution board 15 is coupled adjacent to integration plate 19. RF distribution board 15 typically has multiple layers of interconnect. Moreover, it may be necessary to couple to contact points on the various levels within RF distribution board 15. Contact areas 24 illustrate points on RF distribution board that are coupled to integrated circuit board 14 using pins 17. Contact areas 24 would be etched out to the appropriate layer to expose a contact. Through holes 25 are openings in RF distribution board 15 that allows pins 17 to feedthrough RF distribution board 15 to contact points on distribution layer 20.

Distribution layer 20 is coupled adjacent to RF distribution plate 15. Distribution layer 20 may also comprise multiple layers of interconnect having contact points at each level similar to RF distribution layer 20. Distribution layer 20 includes a connector 26 positioned thereon for receiving and transmitting AC or DC signals. Various electrical components (not shown) such as discrete components or chips may be mounted to the distribution layer 20.

Figure 2:
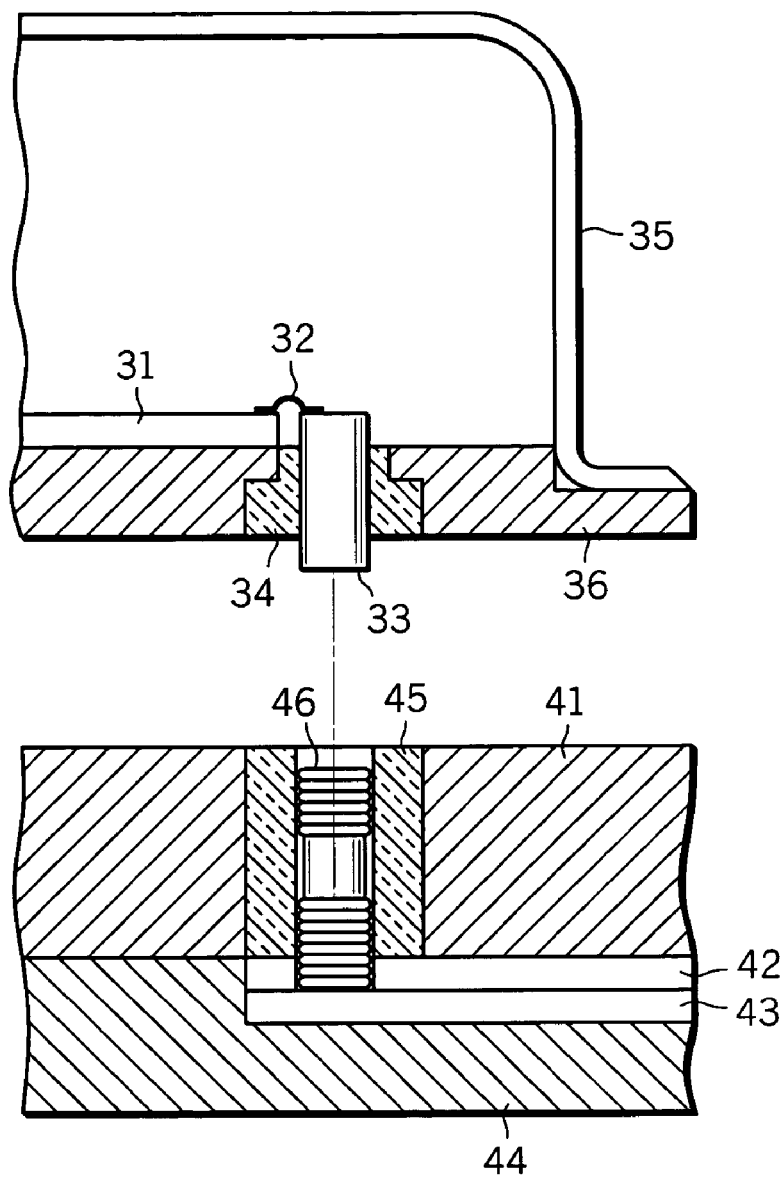
FIG. 2 is a magnified view of a prior art interconnect system.

FIG. 2 is a magnified view of a prior art interconnect system 30. Interconnect system 30 uses a pressure contact for connection. In other words, the connection is achieved by contact under pressure and is not fastened by semi-permanent means such as solder or an interference connection such as a socket. An integrated circuit board 31 may include many circuits operating at radio frequencies. In this embodiment of interconnect system 30, a radio frequency signal is coupled from integrated circuit board 31 to an integrated circuit board 44. Integrated circuit board 31 is fastened to a support structure 36. A cover 35 forms a housing with support structure 36 that encloses integrated circuit board 31. The housing shields integrated circuit board 31 from radio frequency noise external to the housing. Conversely, components external to the housing are shielded from radio frequencies transmitted by integrated circuit board 31.

A through hole or opening is formed in support structure 36. A dielectric sleeve 34 is placed in the opening. A pin 33 couples through dielectric sleeve 34 and extends beyond a bottom surface of support structure 36. Dielectric sleeve 34 is non-conductive to prevent pin 33 from shorting to support structure 36. A wire interconnect 32 is bonded to both integrated circuit board 31 and pin 33.

A composite structure is formed with an integration plate 41 fastened to integrated circuit board 44. Integration plate 41 includes a through hole or opening aligned to pin 33. A dielectric sleeve 45 is placed in the through hole. A compressible bellows interconnect 46 is fitted in dielectric sleeve 45. Compressible bellows interconnect 46 is made of a conductive material. Dielectric sleeve 45 prevents compressible bellows interconnect 46 from shorting to integration plate 41. Compressible bellows interconnect 46 is spring like and can be elastically compressed.

Integrated circuit board 44 includes two layers, a layer 42 and a layer 43. Layers 42 and 43 have interconnect for coupling circuits together. In this embodiment, compressible bellows interconnect 46 contacts layer 43 that lies beneath layer 42. An opening is etched through layer 42 to expose a contact area on layer 43. The contact area of layer 43 aligns with compressible bellows interconnect 46.

Pin 33 is inserted in the opening in integration plate 41 contacting compressible bellows interconnect 46. In general, support structure 36, integration plate 41, and integrated circuit board 44 are fastened together. Pin 33 extending past the bottom surface of support structure 36 presses against compressible bellows interconnect 46. Compressible bellows interconnect 46 compresses in a spring-like fashion forcibly pressing against pin 33 and the contact area of layer 43. Thus, the length of compressible bellows interconnect 46 is designed to ensure that compression occurs. The electrical path created is from integrated circuit board 31 to wire 32, from wire 32 to pin 33, from pin 33 to compressible bellows interconnect 46, and finally from compressible bellows interconnect 46 to the contact area of integrated circuit board 44. The benefit of this interconnect methodology is the simplification of assembly where interconnect is difficult to access and the long term reliability of a stable interconnection as the force exerted by compressible bellows interconnect 46 on pin 33 and the contact area of layer 43 maintains excellent contact.

It should be noted that only one interconnect was shown in FIG. 2 for illustrative purposes but that in practice there would be many similar interconnections in close proximity to each other. What has been identified as a problem is noise introduced through interconnect in close proximity to each other that carry radio frequency signals. It has been determined that radio frequency signals are being transmitted and coupled to compressible bellows interconnect thereby introducing noise. The noise can be of a magnitude where the performance of the system is compromised.

Figure 3:
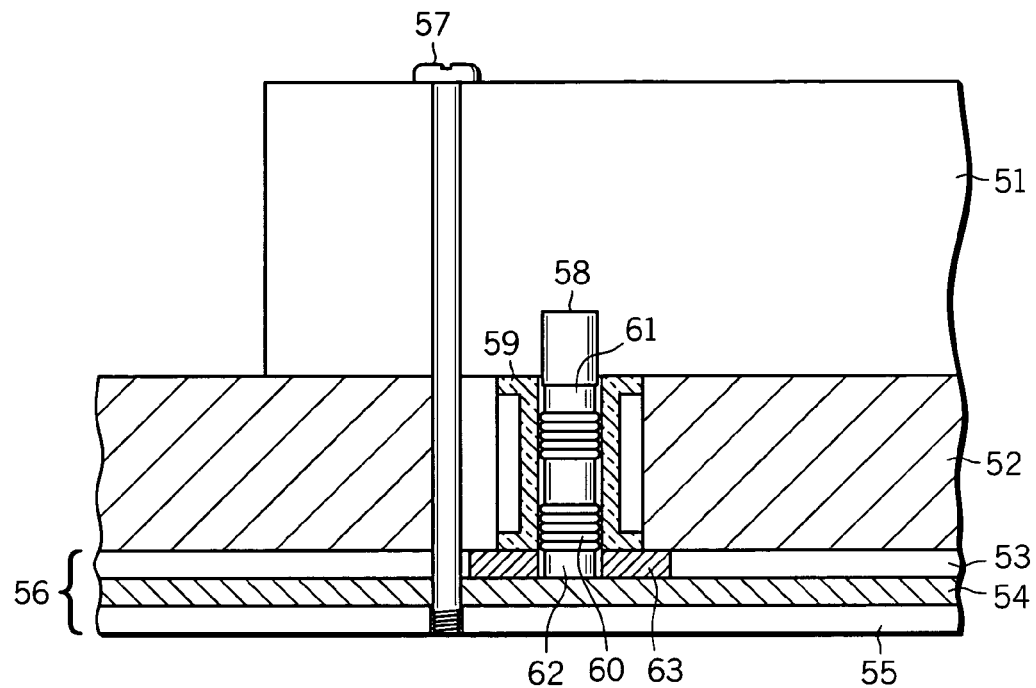
FIG. 3 is a partial cross-sectional view of a radio frequency system in accordance with the present invention.

FIG. 3 is a cross-sectional view of a radio frequency (RF) system 50 in accordance with the present invention. Radio frequency system 50 comprises a module 51, an integration plate 52, and an integrated circuit board 56. In an embodiment of radio frequency system 50, module 51 and integrated circuit board 56 have interconnected electrical components such as integrated circuits, monolithic microwave integrated circuits (MMICs), passive components, or other well-known electrical devices used to form a circuit. Module 51, integration plate 52, and integrated circuit board 56 are fastened together by a bolt 57.

In general, radio frequency system 50 includes many interconnections from module 51 to integrated circuit board 56. A single interconnection is shown to simplify the illustration. A pin 58 extends from a bottom surface of module 51. Pin 58 carries a radio frequency signal from module 51. Integration plate 52 includes a through hole or opening that aligns with pin 58. A dielectric sleeve 59 is placed in the through hole in integration plate 52. In an embodiment of the interconnect, dielectric sleeve 59 is an interference fit that retains dielectric sleeve 59 in the through hole in integration plate 52. The interference fit allows dielectric sleeve 59 to be placed in integration plate 59 during a non-critical time as RF system 50 is assembled.

Integrated circuit board 56 comprises a layer 53, a layer 54, and a layer 55. Integrated circuit board 56 may have significantly more layers of interconnect. Pin 58 is coupled to a contact area on layer 54 that is beneath layer 53. An opening is etched through layer 53 exposing the contact area on layer 54. In an embodiment of integrated circuit board 56, the opening through layer 53 is made larger than the through hole formed in integration plate 52 to expose a ground plane near the contact area on layer 54. At least one conductive elastomeric gasket 63 is placed in an area underlying both integration plate 52 and a portion of dielectric sleeve 59 while overlapping the ground plane on layer 54. Conductive elastomeric gasket 63 can take almost any shape. For example, conductive elastomeric gasket 63 can be circular in shape having a central opening to expose but not contact the contact area for coupling the RF signal to layer 54. The conductive elastomeric gasket 63 would not be completely circular if an interconnect trace or line on layer 54 is required to connect to the contact area on layer 54. Conductive elastomeric gasket 63 would have a gap or slice removed to allow the interconnect to prevent contact of conductive elastomeric gasket 63 from contacting the interconnect trace on layer 54. Thus, conductive elastomeric gasket 63 is shaped, depending on the interconnect implementation to contact more than one component of radio frequency system 50 but does not contact the signal path of the radio frequency signal being connected from module 51 to integrated circuit board 56. Similarly, module 51, integration plate 52, or integrated circuit board 56 is can be shaped to accommodate conductive elastomeric gasket 63. An example, using more than one cylindrical shape conductive elastomeric gasket in conjunction with the components of the RF system being shaped to accommodate the conductive elastomeric gasket will be shown herein below to illustrate that many variations on this theme are possible.

In an embodiment of RF system 50, conductive elastomeric gasket 63 contacts both integration plate 52 and a ground plane (not shown) on layer 54. Conductive elastomeric gasket 63 electrically connects integration plate 52 to the ground plane on layer 54. Thus, establishing intimate ground contact local to the area that could potentially receive or transmit radio frequency signals thereby ensuring maximum shielding and minimum noise coupling. In general, integration plate 52 is made of an electrically conductive material that can shield or reduce the transmission of radio frequency signals from the interconnect coupling module 51 to integrated circuit board 56. Prior art RF systems are designed such that components electrically connect together when assembled and fastened together. Irregularities in the surfaces of the components being mated together, variations in clamping pressure across different areas, the cleanliness of assembly are just a few of the variables that affect these connections. In particular, this was a severe problem for radio frequency coupling of interconnect in close proximity to each other.

Conductive elastomeric gasket 63 is a conformable material that is conductive. It provides additional shielding as well as interconnection between components of RF system 50. In an embodiment of RF system 50, conductive elastomeric gasket 63 is made of a resilient, high temperature range silicone rubber filled with conductive particles. For example, silver particles, silver plated copper beads, or silver plated copper particles are an exampled of the conductive fill component of conductive elastomeric gasket 63. The particles are placed in enough density in the silicone to ensure it is conductive. Conductive elastomeric gasket 63 has dimensions that promote intimate contact when RF system 50 is assembled and fastened together. For example, conductive elastomeric gasket 63 would be made thicker than layer 53 of integrated circuit board 56. Thus, conductive elastomeric gasket 63 would compress ensuring intimate contact with the ground plane of layer 55 and integration plate 52 when the integration plate is placed on integrated circuit board 56. Conductive elastomeric gasket 63 would be designed to have sufficient room to expand horizontally such that it does not make contact with the contact area on layer 54 when compressed.

Integration plate 52 is placed on integrated circuit board 56 after conductive elastomeric gasket 63 is placed on integrated circuit board 56. Integration plate 52 is aligned such that the through hole formed therein exposes the contact area on layer 54. For example, a mechanical means such as an alignment key or dowel could be used to align the structures together. An interconnect comprising a bottom cap 62 (or core), a compressible bellows interconnect 60, and a top cap 61 (or core) is placed through dielectric sleeve 59. A major surface of bottom cap 62 contacts the contact area on layer 54.

Module 51 is then placed on integration plate 52. Module 51 is placed on Integration plate 52 having a contact area aligned with top cap 58. For example, a mechanical means such as an alignment key or dowel could be used to align the structures together. A major surface on top cap 58 contacts the contact area on module 51. In an embodiment of RF system 50, module 51 has a pin 58 extending beyond the bottom surface that contacts the major surface of top cap 58. Alternately, a pin can extend from top cap 58 to contact module 51. Bolt 57 or other fastening means holds RF system 50 together. As bolt 57 is tightened, module 51and integrated circuit board 56 are compressed against integration plate 52. Compressible bellows interconnect 60 is designed such that it compresses when bolt 57 is tightened. Compressible bellows interconnect 60 acts like a conductive spring forcibly holding the major surface of top cap 61 in intimate contact with pin 58 of module 51 and the major surface of bottom cap 62 in intimate contact with the contact area of layer 54. Similarly, conductive elastomeric gasket 63 is compressed having intimate contact with integration plate 52 and the ground plane on layer 54 local to compressible bellows interconnect thereby forming an effective grounded shield to prevent reception or transmission of RF signals thus greatly enhancing the performance of RF system 50.

As shown, at least one conductive elastomeric gasket 63 is used for each through hole in integration plate 52 having compressible bellows interconnect 60. Conductive elastomeric gasket 63 is placed in a proximity to the through hole to ensure the local area of integration plate 52 radially surrounding compressible bellows interconnect 60 is securely coupled to ground and forms a grounded shield to adequately suppress the reception and transmission of RF signals. The spacing or proximal area used for placing conductive elastomeric gasket 63 from compressible bellows interconnect 60 will depend on the materials used in RF system 50 and the frequency of operation. Ideally, conductive elastomeric gasket 63 is placed as close as possible to compressible bellows interconnect 60 and the through hole of integration plate 52.

Figure 4:
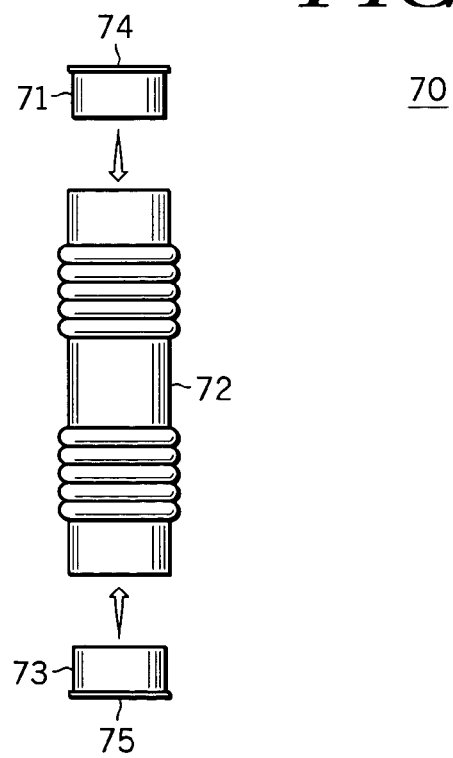
FIG. 4 is a diagram of a compressible interconnect in accordance with the present invention.

FIG. 4 is a diagram of a compressible interconnect 70 in accordance with the present invention. Compressible interconnect 70 comprises a top cap 71, compressible bellows interconnect 72, and a bottom cap 73. Compressible bellows interconnect 70 is a cylindrical hollow structure. Top cap 71 and bottom cap 73 connect to compressible bellows interconnect in a manner that ensures stable physical and electrical contact. For example, the diameter of top cap 71 and bottom cap 72 could be made such that a portion fits in or over compressible bellows interconnect 71 when assembled. Alternately, top cap 71 and bottom cap 73 may reliably rest on bellows interconnect 71 if the dielectric sleeve in which they are fitted prevents movement and maintains alignment of all elements of compressible interconnect 70. Top cap 71 includes a major surface 74 for making an electrical connection. Similarly, bottom cap 73 has a major surface 75 for making an electrical connection.

Compressible interconnect 70 are small making them suitable for high density interconnect typically having a diameter less than 0.1 inches. Spacing between compressible interconnect 70 is typically less than 0.25 inches. The fact that they do not require any manual fastening such as solder makes for simplification of the RF system assembly process. They also do not put heat or chemicals in the RF system that could produce long-term reliability problems. Moreover, the spring like nature of compressible interconnect 70 makes them ideal for situations where contact is required in tight locations at various heights within an integrated circuit board. Disassembly of a RF system is also greatly enhanced for troubleshooting because permanent connections (such as solder joints) are not required to be broken.

In an embodiment of compressible interconnect 70, compressible bellows interconnect 72 is formed over an aluminum mandrel. A nickel alloy is deposited over the aluminum mandrel forming a nickel layer that conforms to the shape of the aluminum mandrel. The nickel layer is used to give compressible bellows interconnect 72 very good spring characteristics. Gold is then deposited over the nickel layer. A gold layer is formed to provide good electrical conductive characteristics. The aluminum mandrel is then exposed by cutting and placed in solution to dissolve the aluminum away leaving the nickel and gold layers forming compressible bellows interconnect 72. Compressible bellows interconnect 72 is somewhat fragile and is typically picked up and placed via a vacuum pick. Similarly, top cap 71 and bottom cap 72 are made of nickel alloy and gold plated for strength and electrical conductivity.

Figure 5:
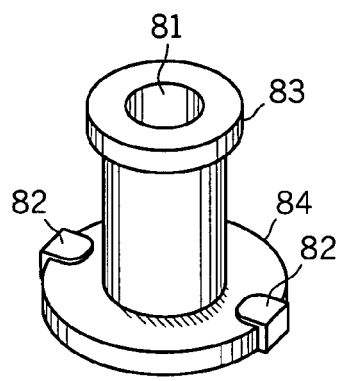
FIG. 5 is an angle view of a dielectric sleeve including two conductive elastomeric gaskets in accordance with the present invention.

FIG. 5 is an angle view of a dielectric sleeve 80 including two conductive elastomeric gaskets 82 in accordance with the present invention. Dielectric sleeve 80 includes a through hole 81 through which a compressible interconnect is placed such as that described in FIG. 4 and holding features for retaining conductive elastomeric gaskets 82. In one embodiment, dielectric sleeve 80 is manufactured from a dielectric material such as nylon. As shown, conductive elastomeric gaskets 82 are cylindrically shaped and fitted in slots cut in dielectric sleeve 80. Conductive elastomeric gaskets 82 extend above and below the slots cut in dielectric sleeve 80. Two conductive elastomeric gaskets 82 are used for redundancy to ensure appropriate shielding and interconnection.

Dielectric sleeve 80 has a first diameter 83 in an upper region and a second diameter 84 in a lower region. The first diameter 83 is smaller than the second diameter 84. The interconnect system formed with dielectric sleeve 80 is a tuned system that can be optimized for performance. One parameter that is optimized is dielectric sleeve 80. In an embodiment of dielectric sleeve 80, first diameter 83 and second diameter 84 are tuned to maximize the ability the interconnect system to pass a specific frequency range and reject frequencies not falling within the chosen band.

Figure 6:
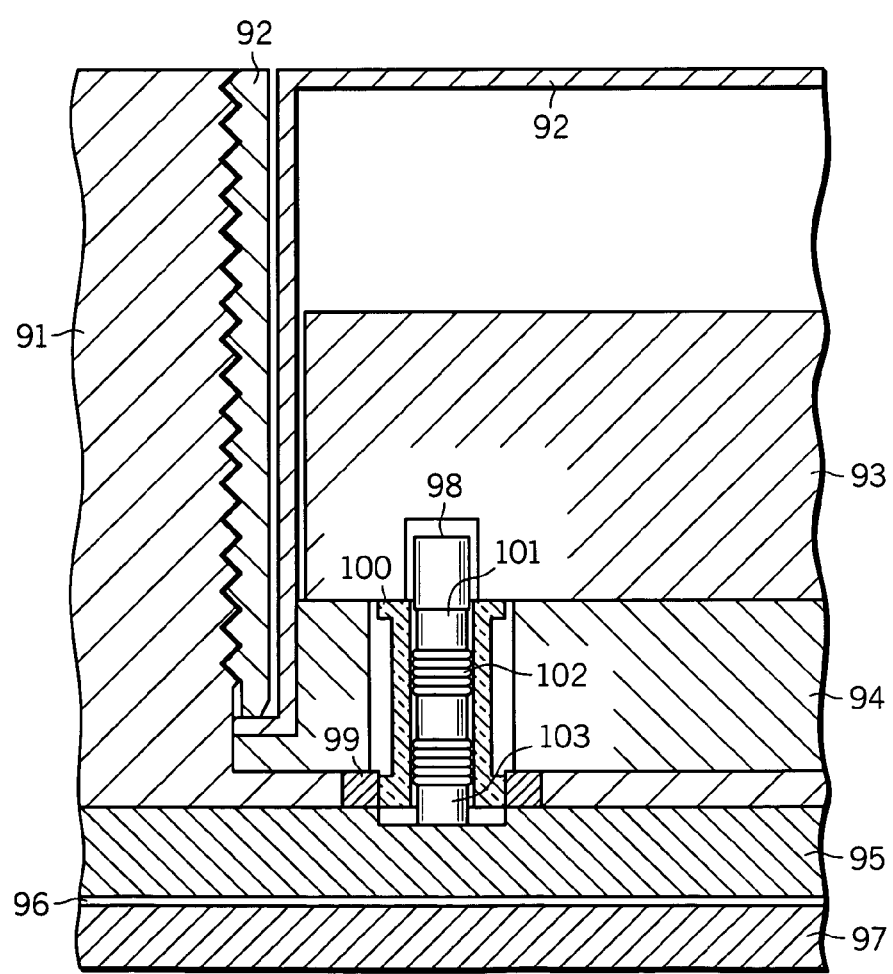
FIG. 6 is a partial cross-sectional view of a compressible interconnect and implemented in a radio frequency system in accordance with the present invention.

FIG. 6 is a partial cross-sectional view of a compressible interconnect implemented in a radio frequency system 90 in accordance with the present invention. Radio frequency system 90 is implemented similar to the illustration of FIG. 1 and is suitable for many different types of high frequency applications including communication satellites. RF system 90 includes a housing/integration plate 91, a module 93, a header 94, a radio frequency (RF) distribution board 95, a dielectric layer 96, and a distribution layer 97. Module 91 includes a pin 98 for coupling a radio frequency signal to RF distribution board 95.

RF distribution board 95 is electrically isolated by a dielectric layer 96 from distribution layer 97. RF distribution board 95, dielectric layer 96 and distribution layer 97 are aligned and stacked on to one another as shown in FIG. 6. RF distribution board 95 and distribution layer 97 may have multiple layers of interconnect and electronic components mounted thereon. A contact area on RF distribution board 95 is exposed for connecting to module 93. In an embodiment of RF frequency system 90, the contact area is in a layer beneath the surface of RF distribution board 95. This is for illustration purposes, the compressible interconnect is useful for contacting any layer on either RF distribution board 95 or distribution layer 97.

Housing/integration plate 91 is aligned to and placed on RF distribution board 95. Housing/integration plate 91 houses module 93 and header 94. In an embodiment of RF system 90, an assembly comprising housing/integration plate 91, RF distribution board 95, dielectric layer 96, and distribution 97 are held together using some type of fastening means, for example bolts.

A dielectric sleeve 100 is formed in a shape similar to that shown in FIG. 5. A compressible interconnect comprising top cap 101, compressible bellows interconnect 102, and bottom cap 103 are placed in dielectric sleeve 100. Two conductive elastomeric gaskets 99 are held in a bottom portion of dielectric sleeve 100. The bottom portion of dielectric sleeve 100 has a larger diameter than an upper portion of dielectric sleeve 100. A through hole or opening is formed in housing/integration plate 91 that accommodates the larger diameter of dielectric sleeve 100. The thickness of the larger diameter region of dielectric sleeve 100 is substantially equal to the thickness of housing/integration plate 91 in proximity to dielectric sleeve 100. In an embodiment of RF system 90, the bottom portion of dielectric sleeve has an interference fit in the through hole in housing/integration plate 91 thereby holding it in place for subsequent assembly steps. Conductive elastomeric gaskets 99 aligns to and contacts a ground plane on a surface of RF distribution board 95. Similarly, a major surface of bottom cap 101 contacts the contact area on RF distribution board 95. Conductive elastomeric gaskets 99 extend above an upper surface of housing/integration plate 91 to ensure contact with header 94.

Header 94 has a through hole or opening that aligns to dielectric sleeve 100. Header 94 is aligned to and placed on housing/integration plate 91 such that dielectric sleeve 100 is fitted in the through hole. In an embodiment of RF system 90, dielectric sleeve 100 does not extend past an upper surface of header 94 and is typically made to be coplanar to the upper surface of header 94. The opening in header 94 accommodates the upper portion of dielectric sleeve 100 having a smaller diameter than the bottom portion. Thus, the through hole in header 94 has a smaller diameter than the corresponding through hole through housing/integration plate 91 for dielectric sleeve 100. This creates a region on the lower surface of header 94 that extends over an upper surface of conductive elastomeric gaskets 99. Header 94 placed on housing/integration plate 91 compresses and contacts conductive elastomeric gaskets 99. The compression of conductive elastomeric gaskets 99 ensures intimate contact with header 94 and the ground plane on RF distribution board 95 to electrically couple them together. Thus, all regions near the compressible interconnect are directly connected to ground preventing external signals from coupling to the compressible interconnect and reducing the transmission of noise from the compressible interconnect. Header 94 includes a flange area that can be clamped down by spanner ring 92.

Pin 98 of module 93 aligns with a through hole opening in dielectric sleeve 100. Module 93 is aligned to and placed on header 94. Pin 94 extends through the through hole in dielectric sleeve 100 contacting a major surface of top cap 101. In an embodiment of RF system 90, module 93 is held to header 94 by some fastening means, for example bolts. Pin 94 compresses compressible bellows interconnect 102. Top cap 101, compressible bellows interconnect 102, and bottom cap 101 act as a spring, that under compression forcibly holds top cap 101 in contact with pin 98 and bottom cap 103 in contact with the contact area of RF distribution board 95 thereby providing an excellent radio frequency connection from module 93 to RF distribution board 95.

Cover 92 is placed over module 93. Cover 92 includes a flange that rests on the flange of header 94. Spanner ring 92 screws into housing/integration plate 91 and applies pressure on the flange of cover 92 and header 94. Spanner ring 92 is cinched down to seal module 93 and prevent exposure of module 93 and the compressible interconnect from an external environment.

As mentioned previously, the compressible interconnect is a non-permanent interconnect that can be used throughout RF module 90 connecting module 93 to different layers in RF distribution board 95 or distribution layer 97. Moreover, the compressible interconnect is a coaxial interconnect with top camp 101, compressible bellows interconnect 102, and bottom cap 103 forming the central conductor, dielectric sleeve 101 forms the dielectric layer surrounding the central conductor, and header 94 (made of an electrically conductive material) with conductive elastomeric gasket 99 forming the shield.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A high frequency interconnect comprising:
    a dielectric sleeve;
    a compressible bellows interconnect fitted within said dielectric sleeve, wherein said compressible bellows interconnect comprises a layer of nickel alloy and a layer of gold;
    a conductive elastomeric gasket shielding a portion of said compressible bellows interconnect, said conductive elastomeric gasket electrically connecting one or more components in contact with said conductive elastomeric gasket to reduce radio frequency coupling with one or more additional interconnects;
    a first cap coupled to a first end of said compressible bellows interconnect having a first major surface coupling to said first end of said compressible bellows interconnect and a second major surface for coupling to a first component; and
    a second cap coupled to a second end of said compressible bellows interconnect having a first major surface coupling to said second end of said compressible bellows interconnect and a second major surface for coupling to a second component, wherein said first cap includes a pin extending from said second major surface for coupling to said first component wherein said compressible bellows interconnect is cylindrical in shape.

2. The high frequency interconnect of claim 1 wherein said dielectric sleeve is formed having a first section having a first diameter and a second section having a second diameter.

3. The high frequency interconnect of claim 2 wherein said dielectric sleeve includes a feature for holding at least one conductive elastomeric gasket.

4. The high frequency interconnect of claim 3 further including a first feature for holding said conductive elastomeric gasket in said second section of said dielectric sleeve wherein said second diameter is greater than said first diameter and wherein a length of said conductive elastomeric gasket extends above and below said second section of said dielectric sleeve.

5. The high frequency interconnect of claim 4 wherein said conductive elastomeric gasket comprises a silver filled silicone rubber.

6. The high frequency interconnect of claim 5 wherein said conductive elastomeric gasket comprises a silver plated bead filled silicone rubber.

7. The high frequency interconnect of claim 6 wherein said first component and said second component are compressed together placing said first cap in intimate contact with said first component and said second cap in intimate contact with said second component and wherein said compressible bellows interconnect acts as a spring to maintain said first and second caps respectively in intimate contact with said first and second components.

8. The high frequency interconnect of claim 7, wherein said conductive elastomeric gasket electrically connects components in contact with said conductive elastomeric gasket forming a shield around said compressible bellows interconnect to reduce radio frequency coupling with the one or more additional interconnects.

* * * * *